(12) United States Patent
Pequignot et al.

(10) Patent No.: US 6,891,207 B2
(45) Date of Patent: May 10, 2005

(54) ELECTROSTATIC DISCHARGE PROTECTION NETWORKS FOR TRIPLE WELL SEMICONDUCTOR DEVICES

(75) Inventors: James P. Pequignot, Essex Junction, VT (US); Jeffrey H. Sloan, Richmond, VT (US); Douglas W. Stout, Milton, VT (US); Steven H. Voldman, South Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 81 days.

(21) Appl. No.: 10/248,329

(22) Filed: Jan. 9, 2003

(65) Prior Publication Data

US 2004/0135141 A1 Jul. 15, 2004

(51) Int. Cl.⁷ .......................... H01L 29/74; H01L 23/62
(52) U.S. Cl. ..................... 257/173; 257/355; 257/546
(58) Field of Search ..................... 257/173, 355–357, 257/360, 546, 653

(56) References Cited

U.S. PATENT DOCUMENTS

| | | | | | |
|---|---|---|---|---|---|
| 5,796,147 | A | * | 8/1998 | Ono | 257/355 |
| 5,905,679 | A | * | 5/1999 | Tsukikawa | 365/189.06 |
| 6,097,078 | A | * | 8/2000 | Sim et al. | 257/548 |
| 6,266,222 | B1 | * | 7/2001 | Colombo et al. | 361/111 |
| 6,329,694 | B1 | * | 12/2001 | Lee et al. | 257/372 |
| 6,521,951 | B2 | * | 2/2003 | Sato et al. | 257/355 |
| 6,563,181 | B1 | * | 5/2003 | Du et al. | 257/394 |
| 2003/0080804 | A1 | * | 5/2003 | Torrisi et al. | 327/536 |

* cited by examiner

*Primary Examiner*—T. N. Quach
(74) *Attorney, Agent, or Firm*—Richard A. Henkler

(57) ABSTRACT

An electrostatic discharge protection network that uses triple well semiconductor devices either singularly or in a series configuration. The semiconductor devices are preferably in diode junction type configuration. A control network can be used to control the biasing when the semiconductor devices are used in a series configuration.

12 Claims, 13 Drawing Sheets

US 6,891,207 B2

ELECTROSTATIC DISCHARGE PROTECTION NETWORKS FOR TRIPLE WELL SEMICONDUCTOR DEVICES

BACKGROUND OF INVENTION

1. Technical Field

The present invention generally relates to electrostatic discharge (ESD) protection circuits and, more particularly, to ESD protection circuits using triple well semiconductor devices residing in an integrated circuit.

2. Related Art

As electronic components are getting smaller and smaller along with the internal structures in integrated circuits, it is getting easier to either completely destroy or otherwise impair electronic components. In particular, many integrated circuits are highly susceptible to damage from the discharge of static electricity. Electrostatic discharge (ESD) is the transfer of an electrostatic charge between bodies at different electrostatic potentials (voltages), caused by direct contact or induced by an electrostatic field. The discharge of static electricity, or ESD, has become a critical problem for the electronics industry. Device failures are not always immediately catastrophic. Often the device is only slightly weakened but is less able to withstand normal operating stresses and, hence, may result in a reliability problem. Therefore, various ESD protection circuits must be included in the device to protect the various components. Multiple considerations are taken into account during the design of such ESD protection circuits.

With system-on-a-chip (SOC), advanced CMOS and high level integration, different circuit and system functions are integrated into a common chip substrate. The industry has expended considerable efforts to prevent noise created by one circuit from infecting another circuit. The industry has used triple well technology to help provide this noise isolation. Unfortunately, with the introduction of triple well technology, several problems must be addressed with respect to ESD networks.

CMOS technology traditionally provided single well or double well isolation. In single well technology, an n-well was placed in a p-type substrate. In dual well technology, a p-well was placed in a p-type substrate as well. For both single and double well, the ESD protection networks were kept the same since the transition from single well to double well did not alter the electrical connections needed for either MOSFET-based ESD protection or diode-based ESD protection networks. The first problem results from the transition from single- or dual-well technology to a triple well technology. The triple well technology requires a region which electrically isolates both the p-well and the n-well from the substrate.

Another problem arises when mixed voltage applications are used. Mixed voltage applications are where the peripheral power supply voltage is different from the native core voltage power, or the input pad voltage exceeds the native core voltage power supply. Mixed voltage applications require unique ESD networks that don"t turn on below the applied voltage condition. In triple well technology, this is a concern since structures must be able to be biased without inadvertent turn-on during the functional regime. ESD networks in a mixed voltage environment may not be able to use MOSFET structures due to electrical overstress of the MOSFET transistor. MOSFET electrical overstress occurs above the native power supply condition due to dielectric overstress.

It would, therefore, be a distinct advantage to have a triple well technology ESD network that could overcome the above noted problems. The present invention provides such an ESD network

SUMMARY OF INVENTION

An electrostatic discharge protection network that uses triple well semiconductor devices either singularly or in a series configuration. The semiconductor devices are preferably in diode junction type configuration.

In one aspect the present invention also includes a control network to control the triple well devices when they are in a series type configuration.

BRIEF DESCRIPTION OF DRAWINGS

The foregoing and other objects, aspects and advantages will be better understood from the following detailed description of a preferred embodiment of the invention with reference to the drawings, in which.

DETAILED DESCRIPTION

The specification refers to various regions as being doped of a particular type (i.e. N or P), it is understood that this refers to type of doping and not the polarity which can be N, N+, N−, P, P+, or P−.

Figure 1:
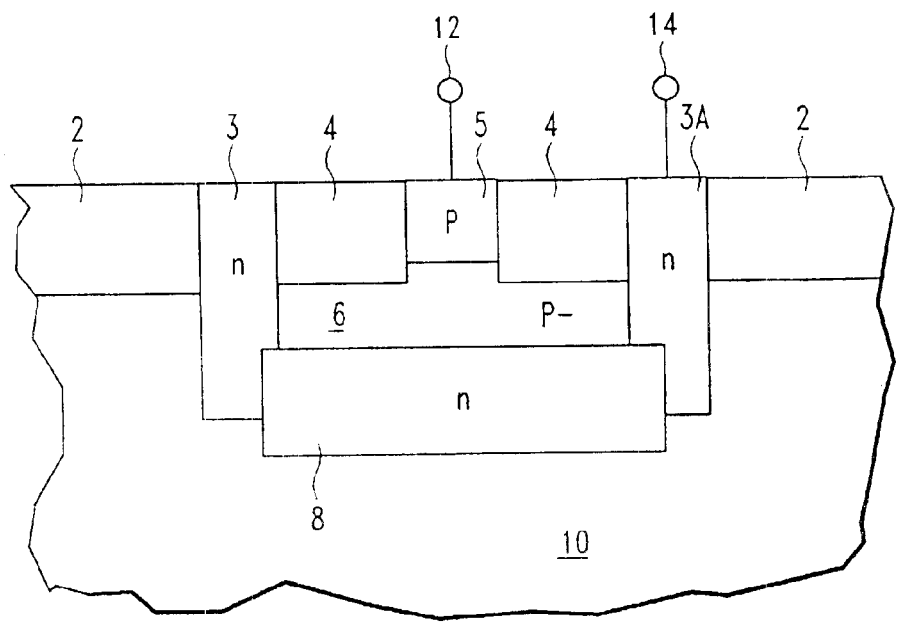
FIG. 1 is a cross sectional diagram illustrating a triple well ESD structure according to the teachings of a preferred embodiment of the present invention.

Referring now to the drawings, and more particularly to FIG. 1, a cross sectional diagram is shown illustrating a triple well ESD structure according to the teachings of a preferred embodiment of the present invention. More specifically, the ESD structure includes an insulator region 2 defining n doped regions 3 and 3A, an insulator region 4 defining a p doped region 5, a p−doped region 6, n doped region 8, and contacts 12 and 14. Regions 2 and 4 can be, for example, a shallow trench isolation (STI) region.

In the preferred embodiment, regions 3 and 3A are n doped and extend down to n doped region 8, and form a ring so as to isolate the p− doped region 6 from the substrate region 10. Regions 3 and 3A can be, for example, an n well implant, a reach-though implant or any other known doping process that allows the dopants to extend below insulation region 2 and connection to n doped region 8. Although not shown, regions 3 and 3A can have insulation in the other dimension leading to the isolation of region 6. In addition, regions 3 and 3A can be formed using a single implant or a plurality of implants of different energies or doses.

Region 6 is p− doped to allow isolation from the substrate region 10. In this embodiment, a p-n diode metallurgical junction is formed where the p− region 6 abuts region 3, region 3A and region 8. This metallurgical junction in this embodiment forms a diode for the application of the ESD protection.

The anode structure of the p-n diode is formed using regions 5 and 6 where region 5 typically has a higher doping concentration as compared to region 6 so that region 5 forms a contact for electrical connection 12. The anode region can be electrically connected to an input pad of a circuit to provide ESD protection.

The cathode structure of the p-n diode is formed from regions 3, 3A, and region 8. Electrical connection to the cathode is established by electrical connection 14. The cathode structure can be connected to a VDD power supply at electrical connection 14 to provide ESD discharge current flow to the VDD power supply. The metallurgical junction formed between region 3, 3A and region 8 and the substrate 10 also forms a second p-n junction which can be used for ESD protection. Connecting regions 3, 3A and 8 to an input pad via electrical connection 14 and grounding the chip substrate region 10, an ESD diode can be established for negative electrical discharges.

Figure 2:
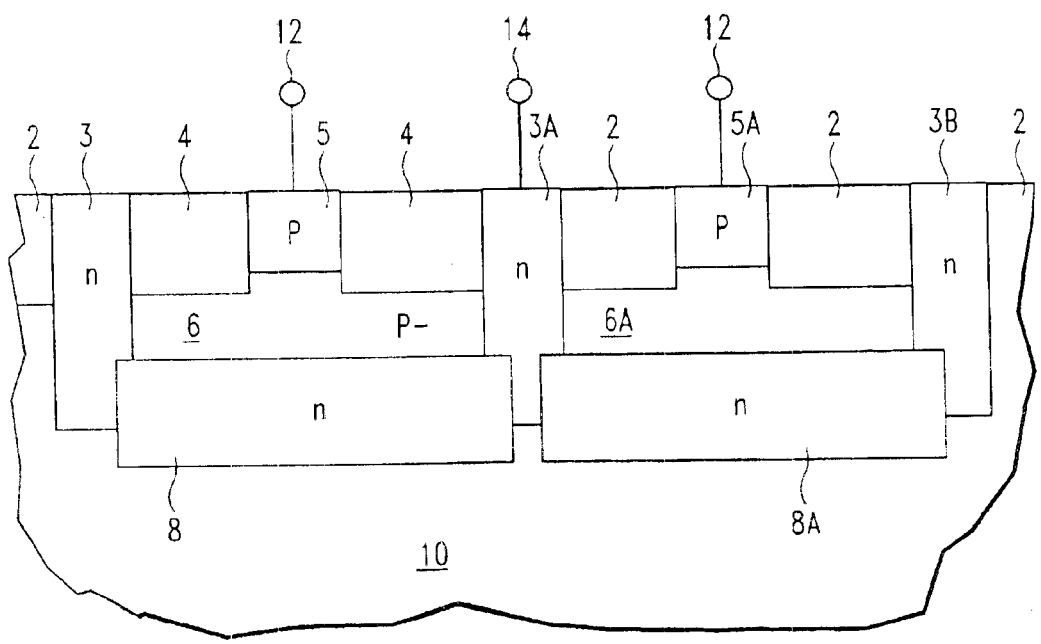
FIG. 2 is a cross sectional diagram illustrating a second preferred embodiment for a triple well diode according to the teachings of the present invention.

Reference now being made to FIG. 2, a cross sectional diagram is shown of a second preferred embodiment for a triple well diode according to the teachings of the present invention. FIG. 2 is similar in structure to FIG. 1 with the addition of a plurality of anode structures located within the cathode. More specifically, FIG. 2 represents the diode of FIG. 1 modified to include an additional p+ anode region 5A, p− anode region 6A, n+/n− well region 3B, and lower n band 8A. The advantage of this structure is that the local placement of 3, 3A and 3B allows for a low resistance cathode structure to avoid resistive regions 8 and 8A.

Regions 8 and 8A can be one continuous n–band (not shown) or a plurality of regions which are connected by n+/n− well regions 3, 3A, and 3B. Additionally, this implementation lends itself to a multiple anode structure contained in a common anode region. In this embodiment, the cathode-to-substrate region can also serve as a diode for ESD discharging to the substrate 10. Additionally, the vertical pnp can play a role in the electrical discharge to the substrate formed from the p+/p− emitter, the n–band base and p-substrate collector.

Figure 3:
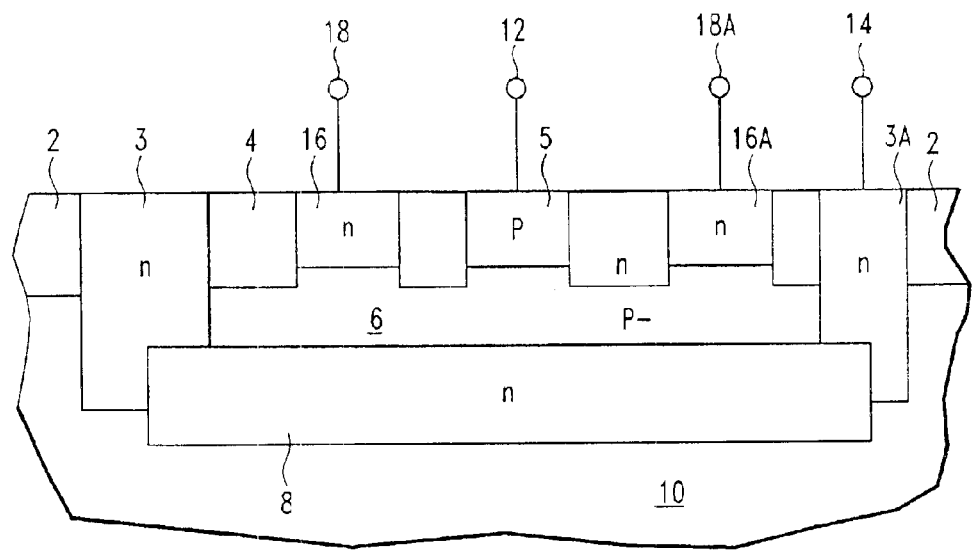
FIG. 3 is a cross sectional diagram illustrating a triple well diode according to the teachings of an alternative preferred embodiment of the present invention.

Reference now being made to FIG. 3, a cross sectional diagram is shown illustrating a triple well diode according to the teachings of an alternative preferred embodiment of the present invention. In this embodiment n+ regions 16 and 16A are defined by isolation regions adjacent to the region 5. Electrical connections 18 and 18A are connected to regions 16 and 16A. Electrical connections 18 and 18A can be the same electrical connection of the well and n–band region 14. In this case, the p-n junction formed between p-region 6 and the n–regions 16 and 16A will provide a lateral current path which is parallel to the p-n junction formed between region 6 and regions 3, 3A and 8. In this embodiment, the capacitance of the structure is higher but allows for lateral discharge of the ESD current from the region 6 to regions 16 and 16A.

In an alternative circuit configuration, electrical connections 18 and 18A can be connected to a second power supply VDD2. In this fashion, the ESD network can be electrically connected from a single input with a discharge path from the input pad to a first and second power supply.

In yet another alternative circuit configuration, the electrical connections 18 and 18A can be connected to an input node, and the electrical connection 12 can be connected to a ground potential. The electrical connection 12 can be at the same potential of substrate region 10 or a second ground potential. In this configuration, the triple well structure can be used for electrical discharge for negative ESD pulses to multiple ground rails from a common input pad connection.

Additionally, the diode structure represented by FIG. 3 can be used as a npn bipolar ESD structure where region 16 and 16A are the emitter, the p–region 6 is the base region, and the n–well/n–band structure 8 can serve as the collector structure. The emitter and collector of the implementation can also be reversed whereas the region 16 and 16A can serve as the collector and the region 8 can serve as the emitter.

In the configuration illustrated in FIG. 3, the n well/n band regions 3, 3A and 8 can be placed to a higher voltage power supply in order to avoid current flow to these regions during overshoot or undershoot operation. It is also possible to allow for the n regions 16 and 16A to be connected to the higher power supply voltage. In this fashion, undesirable noise injection can be collected at an electrode which does not allow the noise injection to enter a power rail which is to be kept free from noise injection.

The structural layout of FIG. 3 could be modified to include a plurality of p regions 5, and n–regions 16 and 16A could be contained within the region 6. In this fashion, a multi-finger structure can be formed to allow for isolation of the entire structure within regions 3, 3A and 8.

Figure 4:
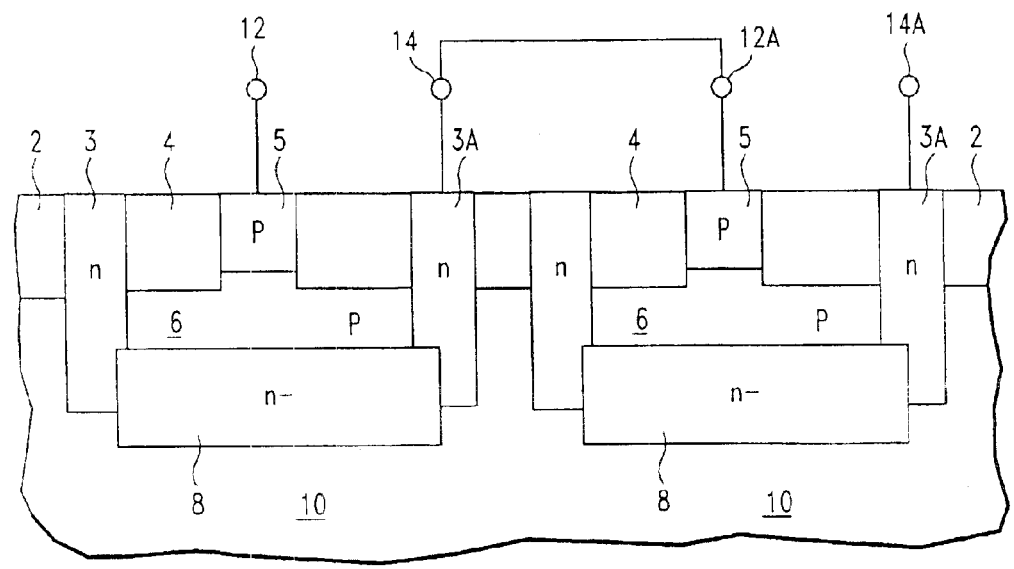
FIG. 4 is a cross sectional diagram illustrating an alternative embodiment of a triple well mixed voltage interface ESD structure formed from the triple well diode elements of FIG. 1 according to the teachings of the present invention.

Reference now being made to FIG. 4, a cross sectional diagram is shown illustrating an alternative embodiment of a triple well mixed voltage interface ESD structure formed from the triple well diode elements of FIG. 1 according to the teachings of the present invention. In this embodiment, each triple well diode structure has their well/n– band region spatially separated and independent of the adjacent structure in the substrate region 10. For mixed voltage applications, when an incoming signal is above the native power supply voltage of a product chip, an ESD structure must be designed to allow for the incoming signal to allow forward biasing of a given ESD diode structure. By connecting the diode structures such as those discussed in FIG. 1, FIG. 2, and FIG. 3 in a series manner, forward biasing of the triple well diode element structure can be avoided by forming a plurality of these structures such that the anode of the first structure is connected to the input pad, and whose cathode is connected to a second structure's anode region, ad infinitum. In this fashion, a series of diode structures are connected to prevent forward biasing of the diodes until the input voltage exceeds the turn-on voltage of the series of elements plus the native power supply voltage.

For example, using a diode structure such as that shown in FIG. 1, a series of elements can be put into a series configuration. In this case, the input pad would be connected to electrical connection 12 and whose output is connection 14 for the first triple well diode element. The cathode electrical connection 14 of the first triple well element is connected to a second triple well element anode element 12A. This forms a plurality of elements, where they are all contained within the same substrate region 10. The last triple well diode element 14A is connected to a power supply (e.g. VDD). In this fashion, the isolation structure which is formed from the n well and band regions has the utility as serving as a cathode contained within the triple well mixed voltage ESD network.

Figure 5:
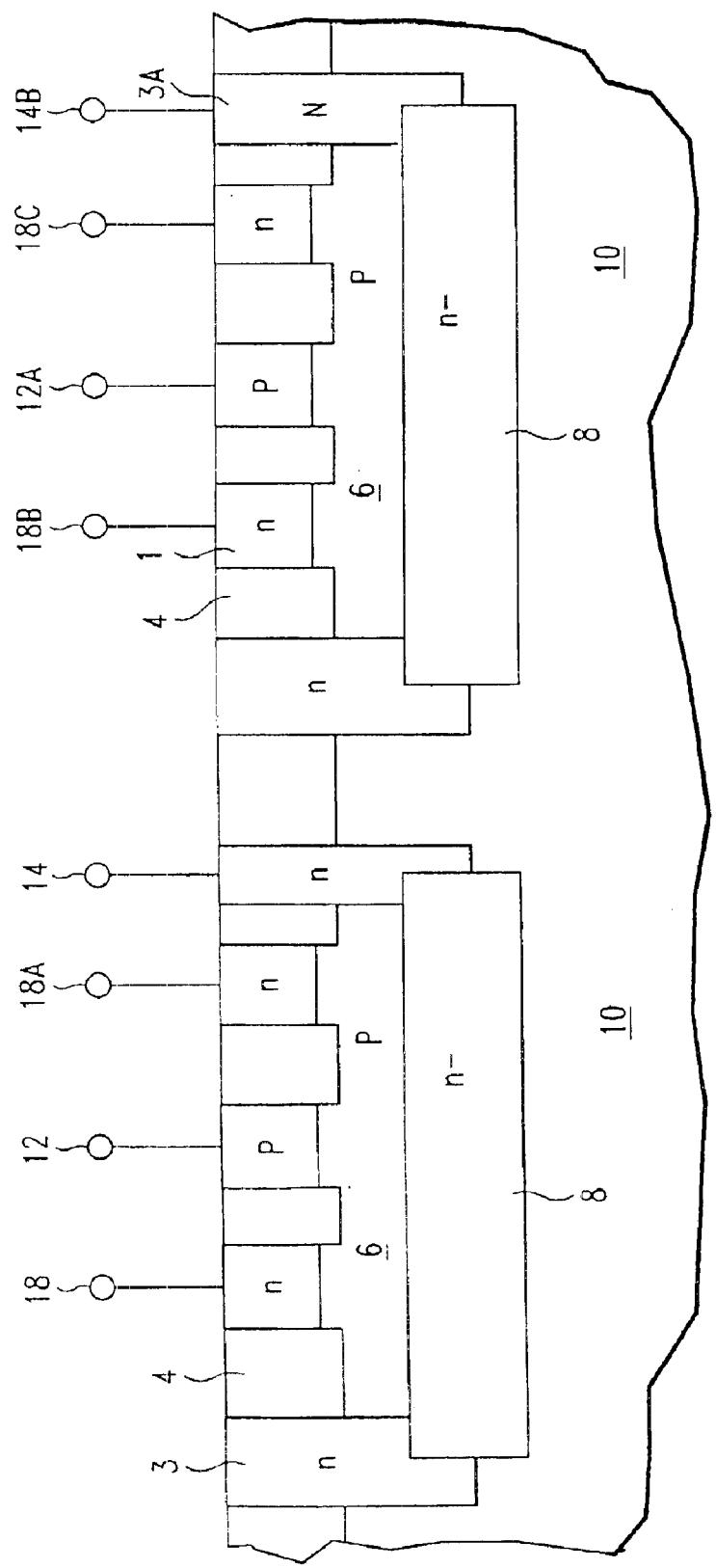
FIG. 5 is a cross sectional diagram illustrating an interface ESD structure formed from triple well diode elements of FIG. 3 according to the teachings of the present invention.

Reference now being made to FIG. 5, a cross sectional diagram is shown illustrating an interface ESD structure formed from triple well diode elements of FIG. 3 according to the teachings of the present invention. Using the diode structure of FIG. 3, a plurality of diode elements can be put into a series configuration where again each n well/n– band region 8 is separated and not abutting the adjacent elements. In this case, the input pad would be connected to electrical connection 12 and whose output is connection 18 and 18A for the first triple well diode element. The output of 18 and 18A are then connected to the anode of the second triple well diode element 12A. In this fashion, the electrical connection 14 can be connected to a high voltage power supply whose voltage is above the input voltage. In this configuration, the n well/n– band structure 8 serves a means of discharge directly to a second power supply instead of through the plurality of triple well diode elements in series. Each triple well diode structure can have an independent electrical connection to a independent power supply or a plurality of power supplies. Given a plurality of triple well diode structures, the independent n–well/n–band regions can be connected to different power supplies different from the power supply connection of the last triple well diode element in the string. The advantage of this implementation is that electrical discharge current can flow to multiple power supplies and noise can be distributed to different supplies.

In an alternative electrical connection, the electrode 14 can be connected to connection 18 and 18A, and 14A can be connected to 18B and 18C allowing parallel discharge paths through the ESD network. In this fashion current flowing from the anode is discharged to both metallurgical junctions. The advantage of this connection is that all the ESD current will flow through the structure.

Figure 6:
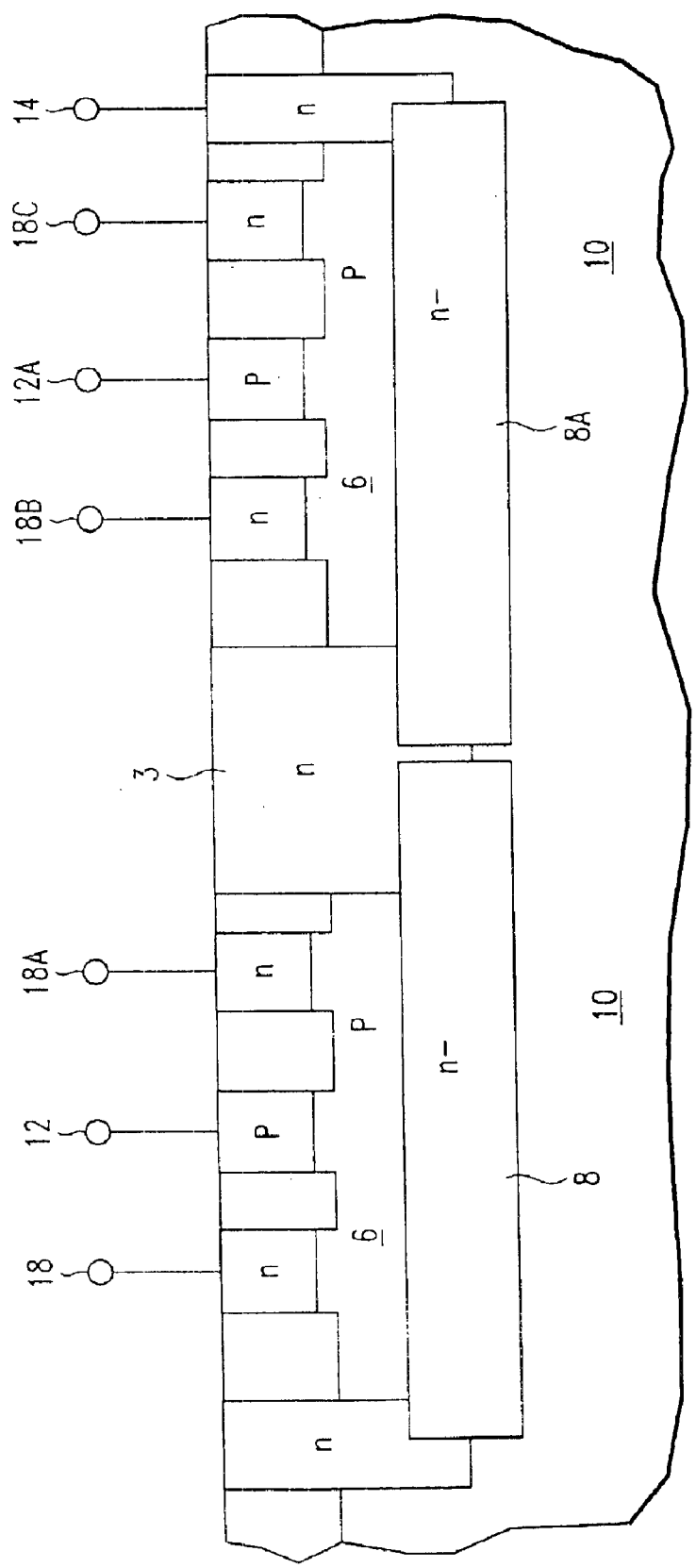
FIG. 6 is a cross sectional diagram illustrating a mixed voltage interface triple well ESD network where the n well/n-band regions are merged as a single region according to the teachings of the present invention.

Reference now being made to FIG. 6, a cross sectional diagram is shown illustrating a mixed voltage interface triple well ESD network where the n well/n– band regions are merged as a single region according to the teachings of the present invention. In this embodiment, the input can be connected to electrical connection 12 serving as an anode region. The cathode is connected to electrical connections 18 and 18A which are connected to the second anode of the second stage 12A. The cathode of the second stage diode is 18B and 18C which are connected to a power supply. The isolation region 14 consisting of the n–well and n–band region cannot be connected to the power supply VDD directly as the current will be one diode voltage from the power supply. This will lead to diode turn-on prior to the mixed voltage condition. The advantage of merging the triple diode successive stages is the density advantage by avoiding the band-to-band isolation rules. Hence, a denser design can be constructed by merging the successive stages.

Figure 7:
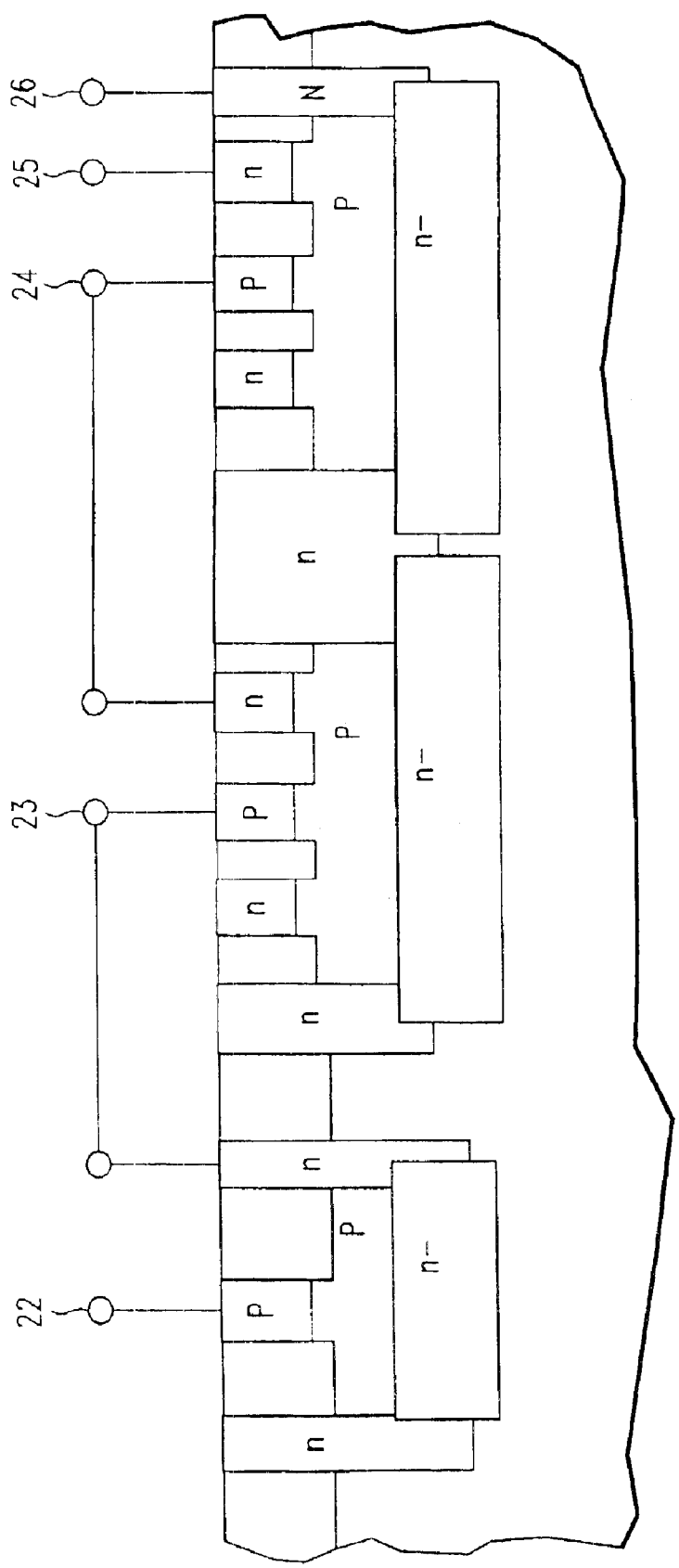
FIG. 7 is a cross sectional diagram illustrating a mixed voltage interface triple well diode ESD network which provides a separate first diode stage followed by a merging of all successive diode stages according to the teachings of the present invention.

Reference now being made to FIG. 7, a cross sectional diagram is shown illustrating a mixed voltage interface triple well diode ESD network which provides a separate first diode stage followed by a merging of all successive diode stages according to the teachings of the present invention. The disadvantage of the embodiment in FIG. 6 is that utilization of the n–well/n–band region for ESD discharge is eliminated and only lateral discharge current paths are provided to the VDD power supply. As a result, a structure which allows discharge to the first triple well diode stage which is independent of the merged isolation band diode regions has both the ESD advantage for the first stage, and the density advantage of all successive stages. Additionally, given a plurality of independent circuits, the successive stages of the triple well diode structure can be shared across circuits for ESD and density advantages. Experimental results have shown a 4× area saving and a 3× ESD improvement in the sharing of successive diode stages. Hence using a diode structure such as those shown in FIGS. 1, 2 and 3 as a first triple well diode stage whose anode is connected to an input pad, and whose cathode is connected to a anode of the merged triple well diode isolation region, as shown in FIG. 6, a new embodiment having the ESD and density advantages are established. The input is connected to electrode 22. The cathode of the first stage is electrical connection 23 which is connected to the anode of the second stage. The cathode of the second stage 24 is connected to the anode of the third stage. The cathode of the third stage 25 is connected to additional stages or a power supply voltage. The n well/n–band region 26 is connected to the same power supply, a reference voltage or an independent power supply.

Figure 8:
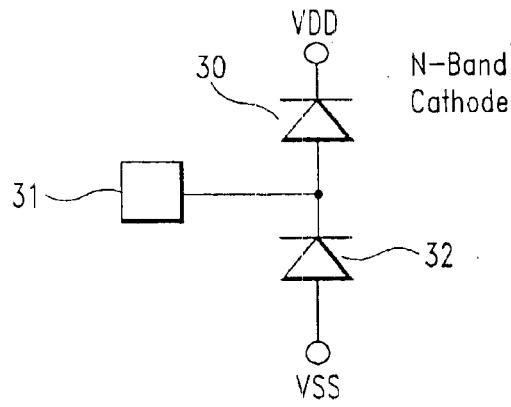
FIG. 8 is a schematic diagram illustrating a circuit implementation of the triple well diode structure of FIG. 1 according to the teachings of the present invention.

Reference now being made to FIG. 8, a schematic diagram is shown illustrating a circuit implementation of the triple well diode structure of FIG. 1 according to the teachings of the present invention. More specifically, two triple well diode structures 30 and 32 as discussed in FIG. 1, are shown. In this embodiment, the anode is a p region 5 and the cathode is a n–band/n well region 8 or other n–doped region 3/3A. The first triple well ESD diode structure 30 has its p/p+ anode 5 connected to an input pad 31, and the cathode 3/3A connected to a power supply VDD. A second triple well ESD diode structure 32 is connected to the input pad 31. In this case the n–band/n–well structure 8 can be connected to the input pad 31, and the substrate is the second electrode. A second orientation is where the input pad 31 is connected to the n–band/n–well structure 8 and the p+ anode region is grounded. In this fashion, ESD current is discharged for negative undershoot or negative pulses.

Figure 9:
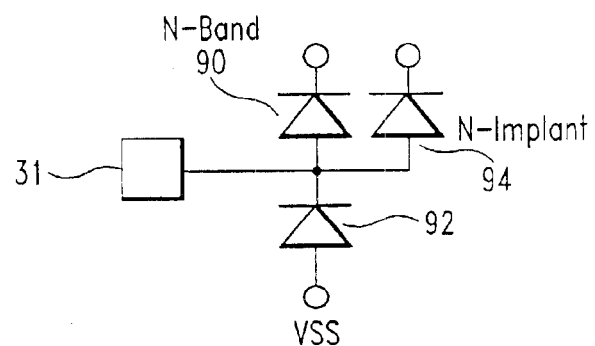
FIG. 9 is a schematic diagram illustrating an electrostatic discharge circuit using the triple well structure of FIG. 3 according to the teachings of the present invention.

Reference now being made to FIG. 9, a schematic diagram is shown illustrating an electrostatic discharge circuit using the triple well structure of FIG. 3 according to the teachings of the present invention. In this case two triple well ESD structures 90 and 92 are used. The first triple well ESD diode structure 90 has its p+ anode 5 connected to an input pad 31 and a first cathode and second cathode where the first cathode is the n–band/n–well cathode structure 8 and the second is a n+ implant 3 as shown in FIG. 3. In this fashion, the first or second cathode can be connected to the same or different power supplies. A second triple well ESD diode structure 92 is connected to the input pad 31. In this case, the n–band/n–well structure 8 can be connected to the input pad 31, and the substrate 10 is the second electrode.

A different orientation can be configured where the input pad 31 is connected to the n–band/n–well structure 8, and the p+ anode region 5 is grounded. In this orientation, ESD current is discharged for negative undershoot or negative pulses. Additionally, using the structure in FIG. 3, the n+ diffusion 3 can be connected to the input pad 31, and the isolated p– region 6 can be connected to the substrate 10 or a second ground electrode. In this configuration, a first and second n–region can provide ESD protection for negative ESD pulse events. Additionally, the n+ region can serve as a npn bipolar element where the n+ region is the emitter and the n–band/n–well region 8 serves as a collector.

Alternative Embodiments for Triple Well

In addition to using the n implants (e.g. 3 and 3a) to form a ring, isolation structures such as Trench Isolation (approx. 2.5 microns) (TI) and Deep Trench Isolation (approx. 5 microns or greater) (DTI) can be used as well. The use of such isolation structures as described below provide improved density for the diode structures, decreases overall capacitance, and provides latchup protection.

Figure 10:
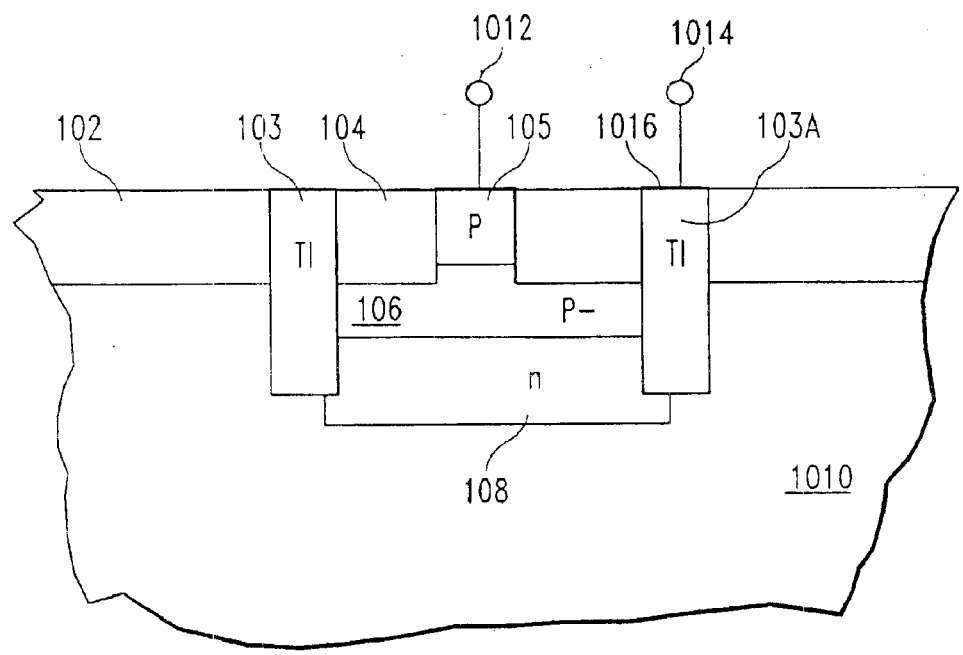
FIG. 10 is a cross sectional diagram illustrating an alternative triple well ESD structure according to the teachings of a preferred embodiment of the present invention.

Referring now to FIG. 10, a cross sectional diagram is shown illustrating an alternative triple well ESD structure according to the teachings of a preferred embodiment of the present invention. More specifically, the ESD structure includes an insulator region 102 defining Trench Isolation (TI) regions 103 and 103A, an insulator region 104 defining a p doped region 105, a p–doped region 106, n doped region 108, contacts 1012 and 1014, and n+/n– doped region 1016. Regions 102 and 104 can be, for example, a shallow trench isolation (STI) region.

In the preferred embodiment, TI regions 3 and 3A, and n+/n– doped region 1016 extend down to n doped region 108 and either reside within region 108 (as shown) or abut the sides of 108 (not shown). Alternatively, an additional n+/n– doped region can be added on the other side of the p doped region 105 (not shown). In addition, either one of the TI regions 103 or 103a can be replaced with moving n+/n– doped region 1016 in their former location.

The n doped region 108 can be formed using high energy implantation. Additionally, this region can be formed using a p– substrate wafer, formation of the n–doped region 108 followed by an epitaxial growth on a p– substrate wafer. The epitaxial region can be doped or p–doped. In the case that the region is n–doped, which is counter-doped to a p–region. The n–doped region can be a collector structure or sub-collector structure to form the isolated p– doped region 106. The n–doped region can be a masked buried layer region formed using high energy implantation.

The TI regions 103 and 103a can be formed early in the semiconductor process before or after formation of the n doped region 108. For a process flow which incorporates epitaxial, the TI region 103 and 103a are formed post-epitaxial deposition. The TI region can be formed as a vertical sidewall or a structure which incorporates a sloped sidewall. The TI region can be formed by an reactive-ion etch (RIE) process. In formation of the TI region, it can be completed prior to or after completion of the front end process. The TI process can be formed by a RIE etch at the contact step. The process flow can incorporate formation of CMOS, or bipolar transistor formation followed by the TI process. At the contact formation, a RIE process is formed etching through at the silicon wafer surface and associated film stacks, glass films, and interconnect levels. The RIE process is followed by a filling process consisting of insulators, or glass depositions. The glass depositions can be boron-phosphorus silicon glass (BPSG), or phosphorus silicon glass (PSG), or other glass materials.

The TI regions 103 or 103a can be formed such that it is abutting or non-abutting against the n–doped region upon formation or post processing. The TI regions 103 or 103a can be placed such that the n–doped region 108 extends beyond the outside edge of the TI region.

The TI regions 103 or 103a can placed such that it abuts the n–doped region 108 to the first top surface but does not extend below the bottom surface of region of n–doped region 108. The TI regions 103 or 103a can extend below both the top and bottom surface of region 108 and extend into the p-substrate region.

Region 106 is p– doped to allow isolation from the substrate region 1010. In this embodiment, a p-n diode metallurgical junction is formed where the p– region 106 abuts region 108 and region 1016. This metallurgical junction in this embodiment forms a diode for the application of the ESD protection.

The anode structure of the p-n diode is formed using regions 105 and 106 where region 10S typically has a higher doping concentration as compared to region 106 so that region 105 forms a contact for electrical connection 1012. The anode region can be electrically connected to an input pad of a circuit to provide ESD protection.

The cathode structure of the p-n diode is formed from regions 108 and 1016. Electrical connection to the cathode is established by electrical connection 1014. The cathode structure can be connected to a VDD power supply at electrical connection 1014 to provide ESD discharge current flow to the VDD power supply. The metallurgical junction formed between regions 8 and 1016, and the substrate 10 also forms a second p-n junction which can be used for ESD protection. Connecting regions 8 and 1016 to an input pad via electrical connection 1014 and grounding the chip substrate region 10, an ESD diode can be established for negative electrical discharges.

Figure 11:
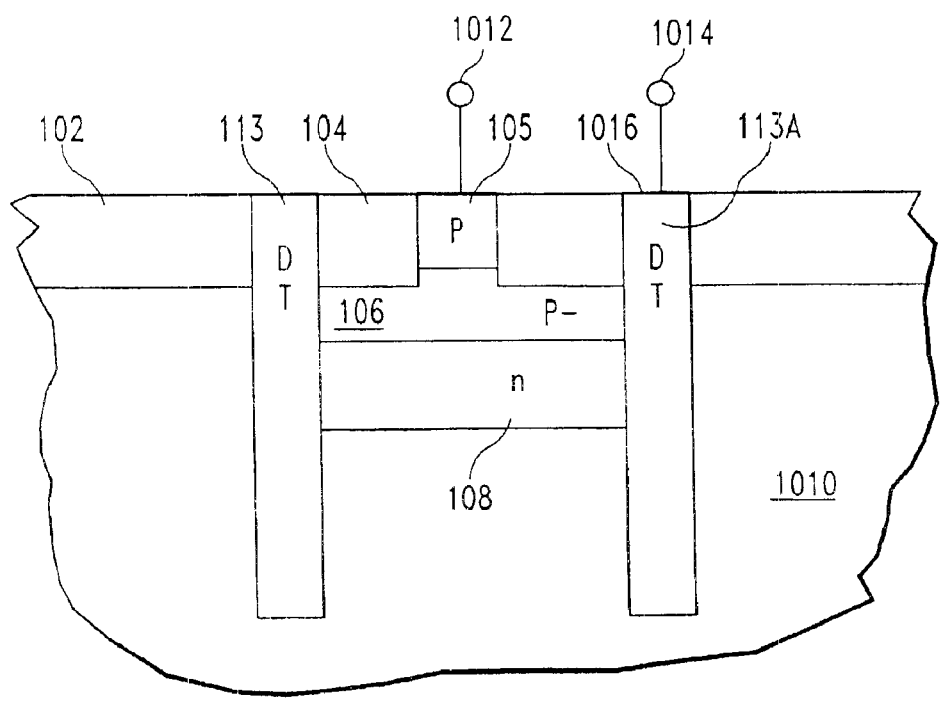
FIG. 11 is a cross sectional diagram illustrating an alternative triple well ESD structure according to the teachings of a preferred embodiment of the present invention.

Reference now to FIG. 11, a cross sectional diagram is shown illustrating an alternative triple well ESD structure according to the teachings of a preferred embodiment of the present invention. The ESD structure is similar to that shown in FIG. 10, with the exception that the TI structures 103 and 103*a* are replaced with DPTI structures 113 and 113*a*.

In the case of the DTI regions 13 and 113*a*, a deep trench is formed early in the process flow prior to formation of CMOS MOSFET formation (e.g. STI formation, source/drain implantation and gate structures) in the case of CMOS or BiCMOS implementation. For a BiCMOS process it is formed prior to the formation of shallow trench isolation, base and emitter structures. In the case of silicon germanium or silicon germanium carbon technology, it is done prior to the deposition of the epitaxial SiGe or SiGeC film. DTI region 113 is discussed below and the discussion is equally applicable to DTI region 113*a*.

The DTI region 113 requires a RIE process to form the trench opening. An insulator is then formed on the sidewall of the DTI region 113. The DTI region 113 is then filled with a polysilicon film. The STI can be formed over the DTI region 113 near the silicon surface.

Introduction of the TI or DTI region has advantages for optimization of the ESD structure. By using the TI or DTI region, diffusion of the n–doped region 108 implant can be minimized. The reduction of the lateral chemical diffusion will allow for a denser ESD structure allowing closer spacing of the adjacency between two structures. Additionally, other semiconductor structures and circuits can be placed closer to the circuit reducing the amount of wasted area between the ESD circuit and the adjacent surrounding circuitry.

Furthermore, the placement of the TI or DTI region allows for reduction of minority or majority injection into the substrate region. This minimizes noise injection into the chip substrate. The placement of TI and DTI also improves the internal latchup robustness of the ESD network. Internal latchup can occur between the ESD network pnp and external npn transistors adjacent to the structure.

In addition, external latchup can be also minimized. External latchup can occur when the ESD network injects current into the substrate leading to potential disturbances. These substrate potential disruptions can introduce logic upsets or latchup in networks. The TI and DTI form internal guard ring structures inherent in the ESD design to minimize internal latchup, external latchup, noise injection, and substrate disturbs.

Figure 12:
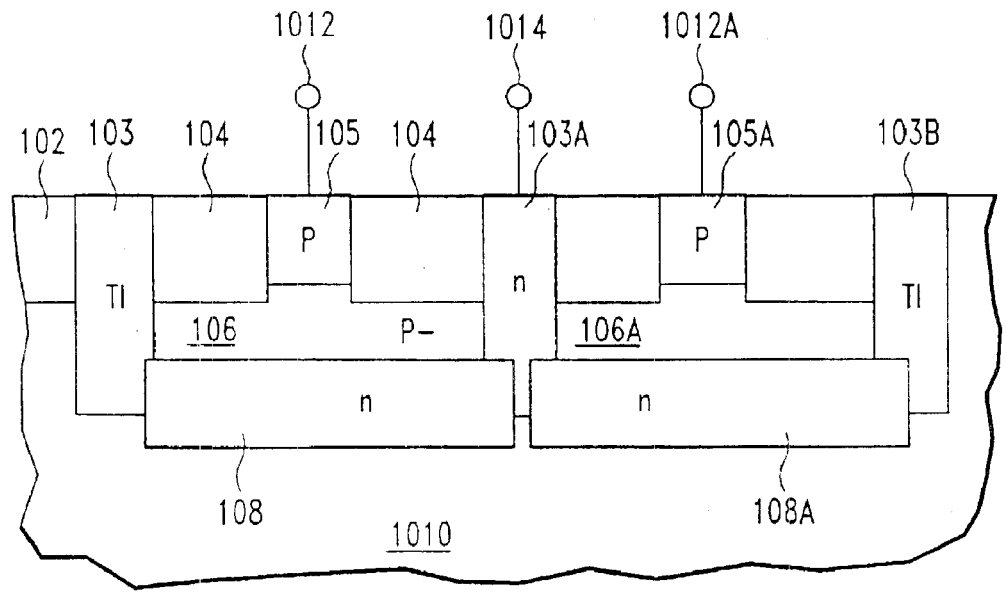
FIG. 12 is a cross sectional diagram illustrating an alternative preferred embodiment for a triple well diode according to the teachings of the present invention.

The TI and DTI region can also improve the capacitance loading of the network. The presence of TI and DTI allows for reduction of the sidewall capacitance from the n–band region. This improves chip performance and loading concerns. Placement of TI or DTI region in the first diode structure enables reduction of the capacitance loading. It should also be noted that either the TI or DTI regions could have side insulator walls and be filled with polysilicon such that they provide contact with the underlying n doped region (e.g. 108, 108*a*) Reference now being made to FIG. 12, a cross sectional diagram is shown of an alternative preferred embodiment for a triple well diode according to the teachings of the present invention. FIG. 12 is similar in structure to FIG. 10 with the addition of a plurality of anode structures located within the cathode. More specifically, FIG. 12 represents the diode of FIG. 10 modified to include an additional p+ anode region 105A, p– anode region 106A, TI region 103B, and lower n band 108A.

Regions 108 and 108A can be one continuous n–band (not shown) or a plurality of regions which are connected by n+/n– well region 103A. Additionally, this implementation lends itself to a multiple anode structure contained in a common anode region. In this embodiment, the cathode-to-substrate region can also serve as a diode for ESD discharging to the substrate 1010. Additionally, the vertical pnp can play a role in the electrical discharge to the substrate formed from the p+/p– emitter, the n–band base and p–substrate collector.

Figure 13:
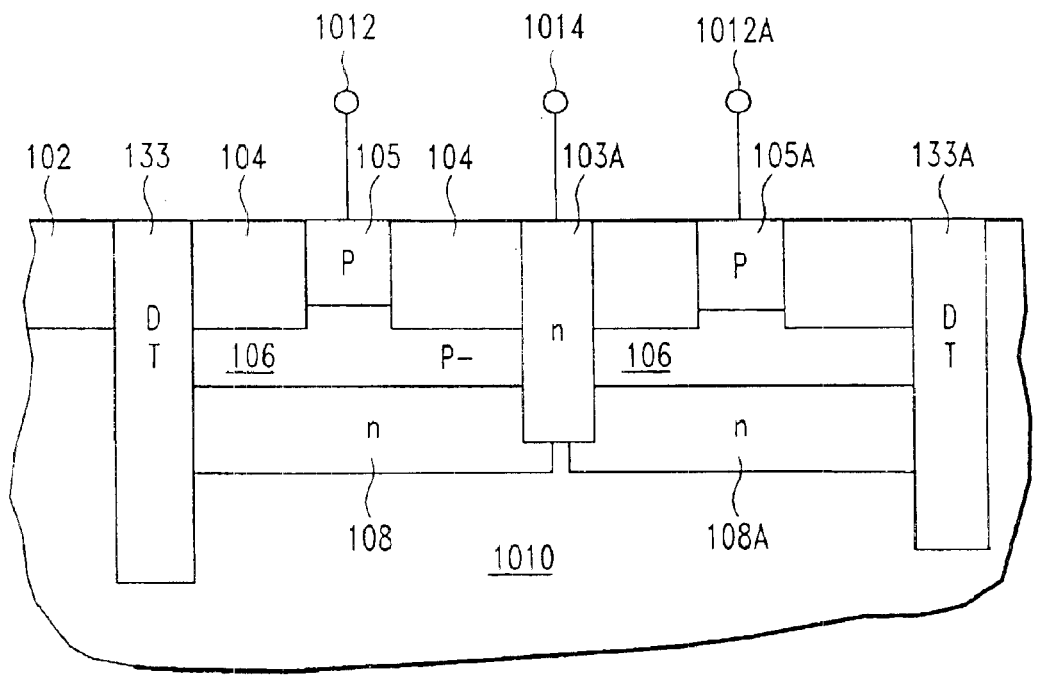
FIG. 13, a cross sectional diagram illustrating an alternative preferred embodiment for a triple well diode according to the teachings of the present invention.

Reference now being made to FIG. 13, a cross sectional diagram is shown of an alternative preferred embodiment for a triple well diode according to the teachings of the present invention. The triple well diode of FIG. 13 is representative of the diode shown in FIG. 12 with the exception of the swapping of the TI 103 and 103*a* with DPTI structures 133 and 133B.

Figure 14:
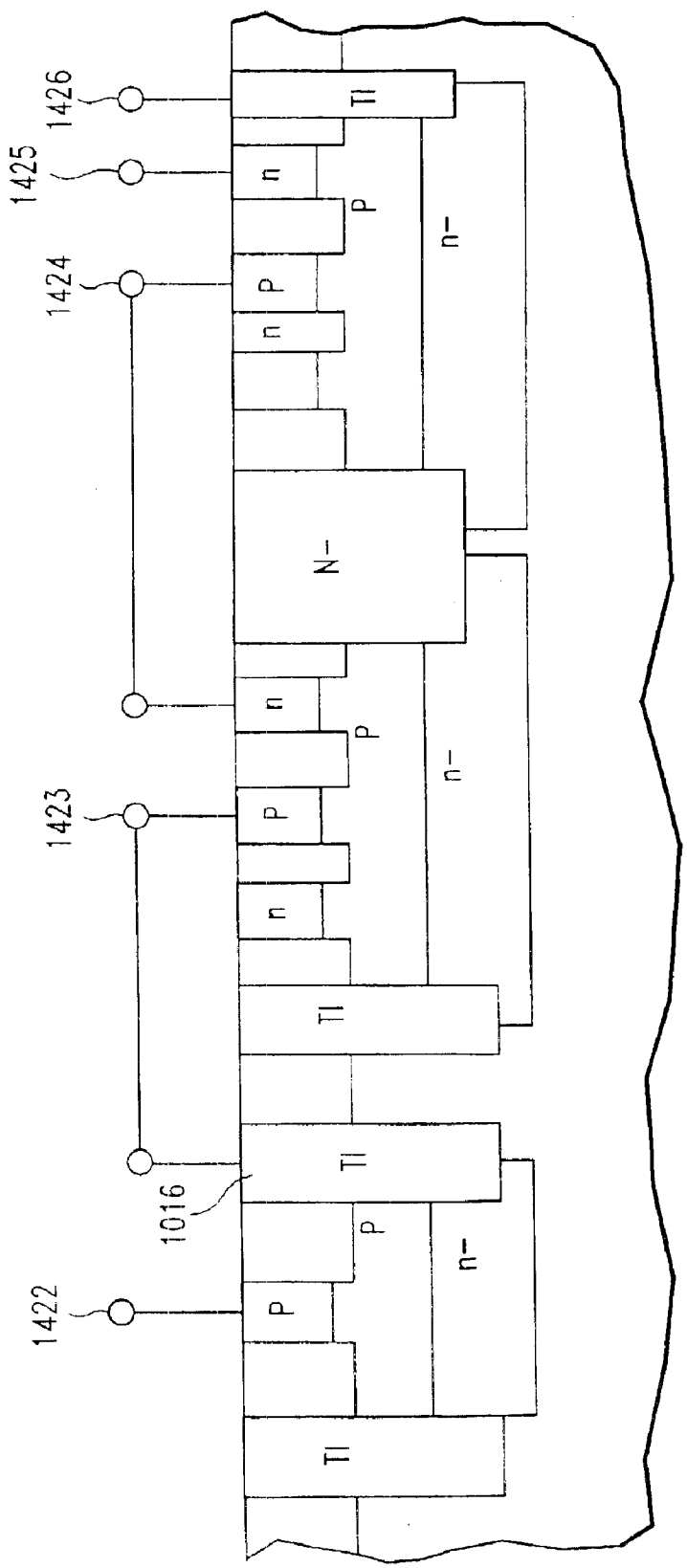
FIG. 14 is a cross sectional diagram illustrating an alternative mixed voltage interface triple well diode ESD network which provides a separate first diode stage followed by a merging of all successive diode stages according to the teachings of the present invention.

Reference now being made to FIG. 14, a cross sectional diagram is shown illustrating an alternative mixed voltage interface triple well diode ESD network which provides a separate first diode stage followed by a merging of all successive diode stages according to the teachings of the present invention. The disadvantage of the embodiment in FIG. 13 is that utilization of the n–well/n–band region for ESD discharge is eliminated and only lateral discharge current paths are provided to the VDD power supply. As a result, a structure which allows discharge to the first triple well diode stage which is independent of the merged isolation band diode regions has both the ESD advantage for the first stage, and the density advantage of all successive stages. Additionally, given a plurality of independent circuits, the successive stages of the triple well diode structure can be shared across circuits for ESD and density advantages. Experimental results have shown a 4× area saving and a 3× ESD improvement in the sharing of successive diode stages. Hence using a diode structure such as those shown in FIG. 10 as a first triple well diode stage whose anode is connected to an input pad, and whose cathode is connected to a anode of the merged triple well diode isolation region, as shown in FIG. 13, a new embodiment having the ESD and density advantages are established. The input is connected to electrode 1422. The cathode of the first stage is electrically connected to the anode of the second stage 1423. The cathode of the second stage is connected to the anode of the third stage 1424. The cathode of the third stage 1425 is connected to additional stages or a power supply voltage. The n well/n–band region 1426 is connected to the same power supply, a reference voltage or an independent power supply.

Figure 15:
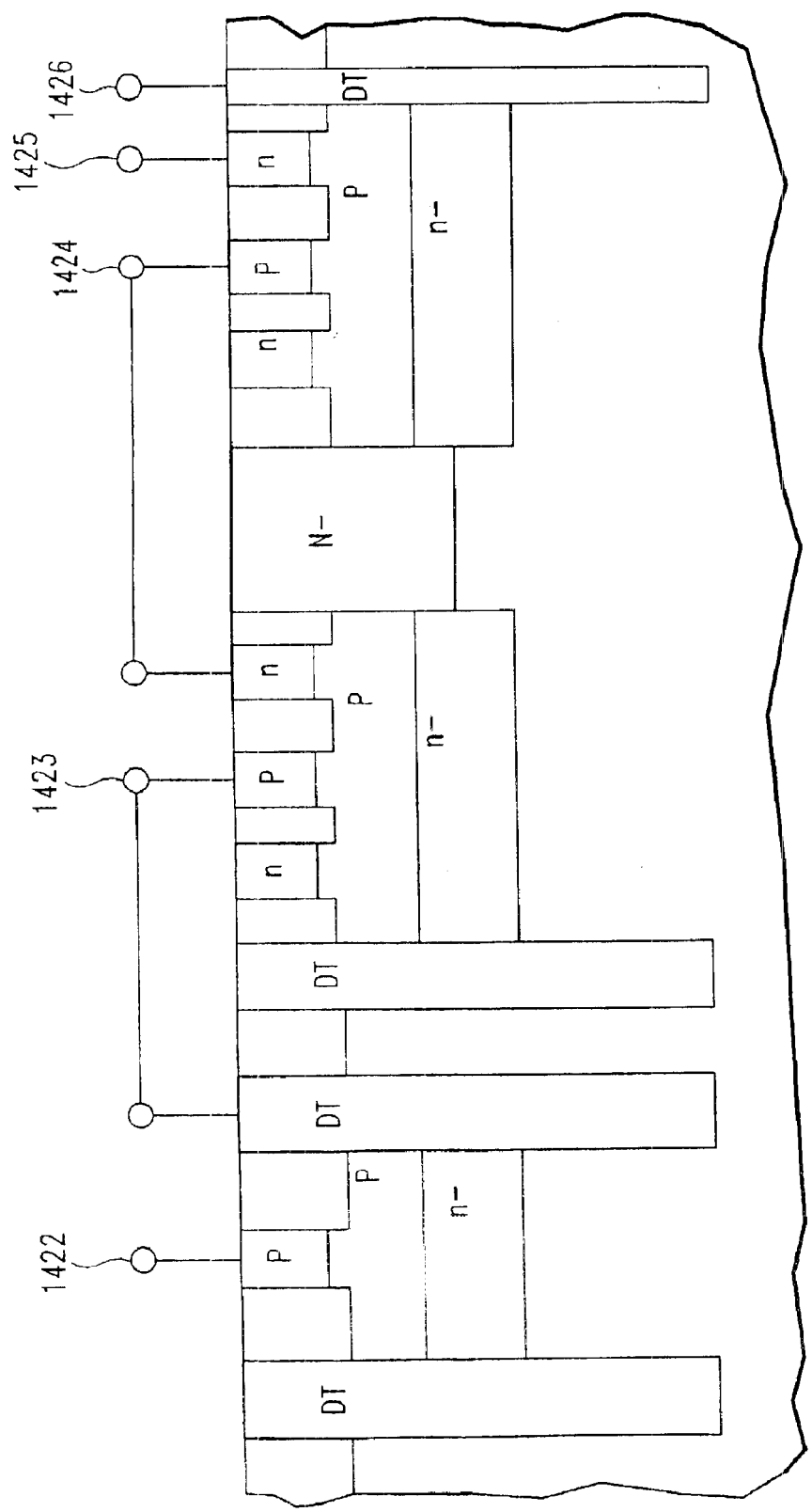
FIG. 15 is a cross sectional diagram illustrating an alternative mixed voltage interface triple well diode ESD network which provides a separate first diode stage followed by a merging of all successive diode stages according to the teachings of the present invention.

Reference now being made to FIG. 15, a cross sectional diagram is shown illustrating an alternative mixed voltage interface triple well diode ESD network which provides a separate first diode stage followed by a merging of all successive diode stages according to the teachings of the present invention. FIG. 15 is representative of FIG. 14 with the exception of the swapping of the TI structures with Deep trench isolation structures.

In systems with multiple power supplies and multiple grounds, sequencing of the power supplies is important to prevent forward biasing or latchup. Mis-sequencing can occur between power supply-to-power supply, ground-to-ground, and input pad-to-power supply, or input pad-to-ground, or input pad-to-input pad.

Power up sequencing can lead to latchup. The improper sequencing can lead to forward biasing and initiating a latchup event.

Figure 16:
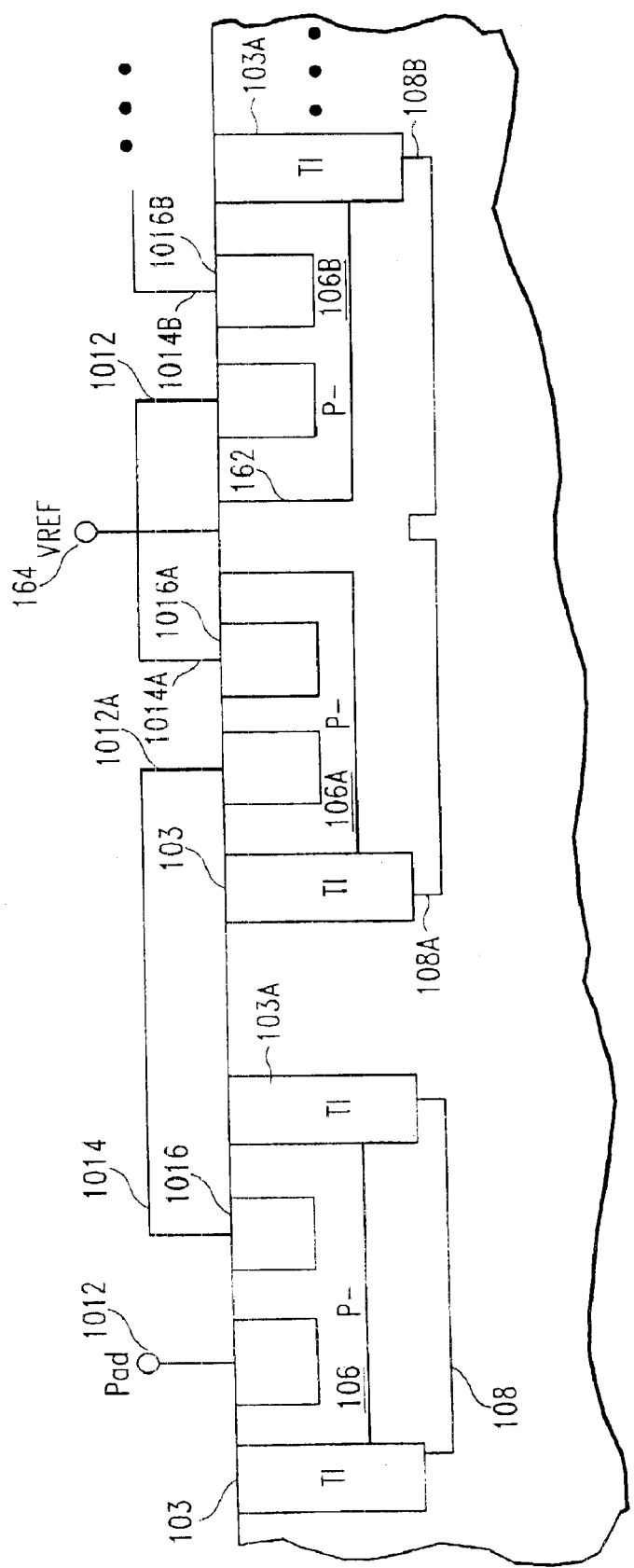
FIG. 16 is a cross sectional diagram illustrating a mixed voltage interface triple well diode ESD network which provides a separate first diode stage followed by a merging of all successive diode stages according to the teachings of the present invention.

Reference now being made to FIG. 16, a cross sectional diagram is shown illustrating a mixed voltage interface triple well diode ESD network which provides a separate first diode stage followed by a merging of all successive diode stages according to the teachings of the present invention. As previously explained, the merging of successive diode stages has several density advantages. The input is connected to electrode 1012. The cathode of the first stage is electrically connected 1014 to the anode 1012a of the second stage. The cathode of the second stage 1014a is electrically connected to the anode of the third stage 1012b. The cathode of the third stage 1014b is electrically connected to additional stages or a power supply voltage. The n well/n–band region 162 is connected to a control network 164 (VREF) that senses the input pad voltage. If the input pad voltage is low, the n well/n–band region 162 is biased to the VDD power supply. If, however, the input pad 1012 voltage is high, then the n well/n–band region 162 is placed in a float condition, thus preventing the forward biasing of the parasitic elements contained in the n–band region. This also prevents the short circuiting of the elements in the series string of elements.

Figure 17:
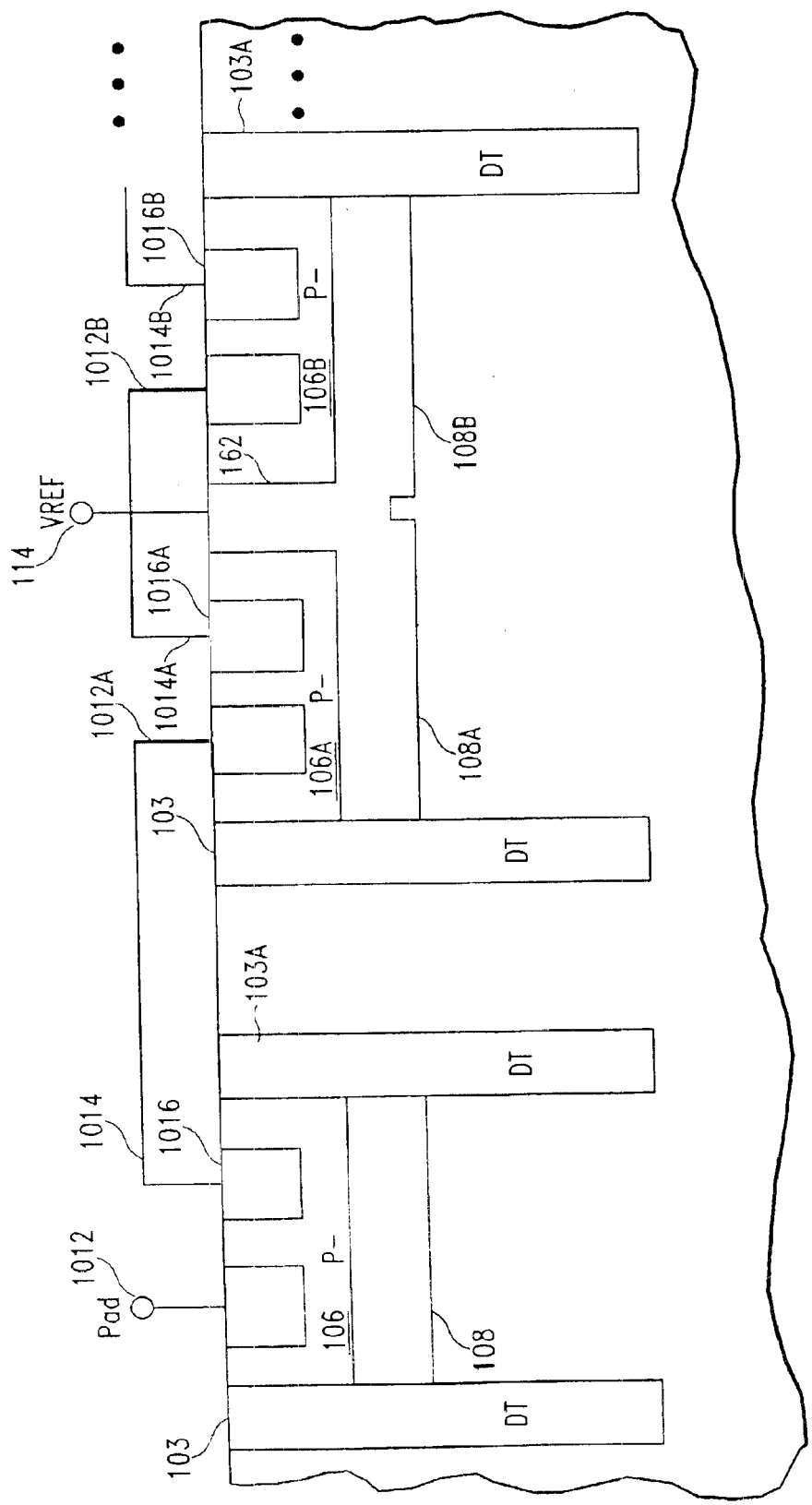
FIG. 17 is a cross sectional diagram illustrating an alternative mixed voltage interface triple well diode ESD network which provides a separate first diode stage followed by a merging of all successive diode stages according to the teachings of the present invention.

Reference now being made to FIG. 17, a cross sectional diagram is shown illustrating an alternative mixed voltage interface triple well diode ESD network which provides a separate first diode stage followed by a merging of all successive diode stages according to the teachings of the present invention. The ESD network shown in FIG. 17 is representative of that shown and discussed in connection with FIG. 16, with the exception that DPT have replaced the STIs.

Figure 18:
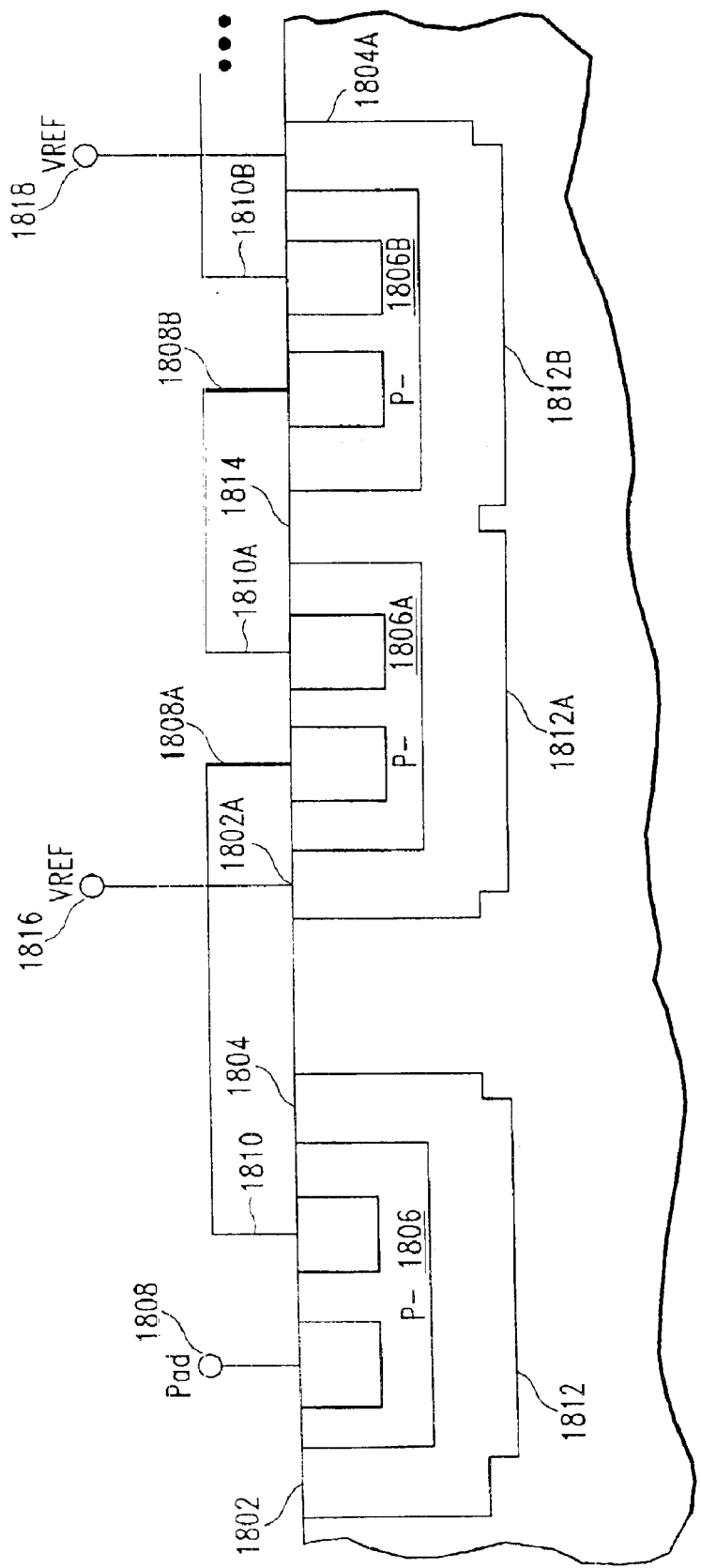
FIG. 18 is a cross sectional diagram is shown illustrating a mixed voltage interface triple well diode ESD network which provides a separate first diode stage followed by a merging of all successive diode stages according to the teachings of the present invention.

Reference now being made to FIG. 18, a cross sectional diagram is shown illustrating a mixed voltage interface triple well diode ESD network which provides a separate first diode stage followed by a merging of all successive diode stages according to the teachings of the present invention. As previously explained, the merging of successive diode stages has several density advantages. FIG. 18 is similar in many aspects to the ESD network of FIG. 16, with the exception that the STIs have been replaced with n+/n– wells. In addition, control networks 1818 and 1816 control the potential of 1812.

Figure 19:
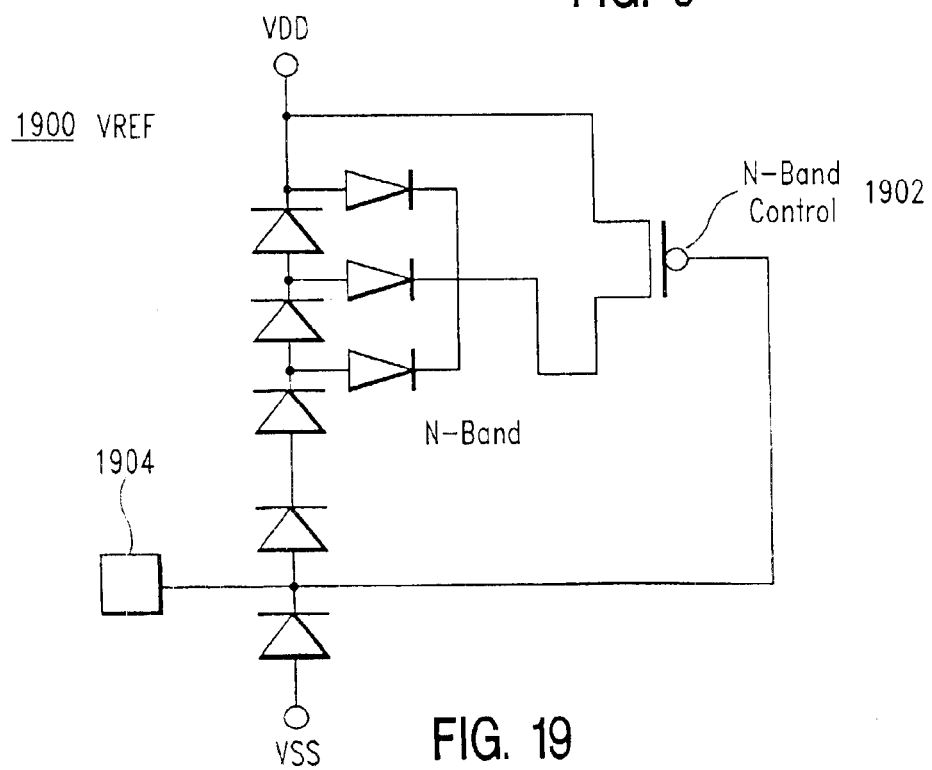
FIG. 19 is a schematic diagram illustrating an example of a control network that can be used with the ESD networks of FIGS. 16–18 according to the teachings of the present invention.

Reference now being made to FIG. 19, a schematic diagram is shown illustrating an example of a control network 1900 that can be used with the ESD networks of FIGS. 16–18 according to the teachings of the present invention. The n–band control network 1900 can consist of p–channel, or n–channel MOSFET elements to control the voltage state of the n–band. In this embodiment, a p–channel MOSFET 1902 having its gate connected to the input pad 1904, source connected to a power supply VDD, and drain connected to the n–band well.

If the input pad 1904 rises above the VDD power supply, the n–band would undergo a floating state. This would prevent forward biasing and discharging to the n–band. In the case where the power supply is at a ground potential, and if the pad rises faster than the power supply is rising, it would prevent discharge to the VDD power supply. The control network 1900 provides sequence independent concerns in the ESD network.

The potential control of the n–band structure can prevent onset of latchup and unanticipated events leading to destruction of the ESD network or adjacent circuitry. Use of p–channel MOSFETs can be used in diode configuration between VDD and the n–band potential, and between the input node and the n–band can be provided to addresses smoother transitions. Additionally, the use of p–channel transistor in diode-configurations can also be used so as to allow the n–band to rise to a full VDD or power supply potential. For example, between VDD and the n–band, a p–channel MOSFET source and drain can be placed. The gate of the p–channel MOSFET can be connected to VDD. A second transistor can be placed between the n–band and the input node, the source and drain are connected and whose gate is connected to the input pad.

Various modifications may be made to the structures of the invention as set forth above without departing from the spirit and scope of the present invention as described and claimed. The spirit of the invention would allow for alternative diode and bipolar structures which are present in RF CMOS technology, BiCMOS technology, BiCMOS Silicon Germanium, BiCMOS Silicon Germanium Carbon, and Silicon on Insulator (SOI) technology. In BICMOS technology, epitaxial regions can be deposited on the silicon surface to provide a p–type anode structure. Using selective epitaxial deposition techniques, silicon anode structures can be formed above the surface as shown in FIG. 1 to FIG. 7. In this fashion, the spirit of the triple well ESD structure can be fulfilled and combined and/or modified to achieve the utility of the present invention. This epitaxial film can contain Silicon, Germanium or Carbon atoms to form the epitaxial region. In the spirit of the present invention, Schottky diodes, Mott diodes, and Zener diodes can be formed for the anode structure to fulfill the utility of the present invention and may be combined and/or modified.

Various aspects of the embodiments described above may be combined and/or modified. In the present invention, the electrical circuits and series configurations can be connected between two power supplies of a common voltage, two power supplies of different voltage, between a ground and power supply rail and between two ground rails. A plurality of these structure can be used in combination and permutation between system power rails or system on a chip design on a common or different substrate.

Various modification of the control network can be provided to improve the control network potential in direct current (dc), alternating current (ac), and in transient state.

What is claimed is:

1. A circuit comprising:
    a plurality of triple well diodes coupled in series with one another, each one of the diodes having a shared n doped region.

2. The circuit of claim 1 further comprising:
    a control device coupled to the shared n doped region to control the biasing of the shared n doped region.

3. A semiconductor device comprising:
    a substrate of a first dopant type;
        a first doped region residing within the substrate, the doped region being of a second dopant type;
        a second doped region residing above the first doped region;
        a third doped region residing above the second doped region;
        a poly silicon gate defining the edges of the third doped region; and
        a fourth structure separating the second doped region from the substrate.

4. A semiconductor comprising:
    a plurality of devices where a first one of the devices is coupled serially to a second one of the devices, each one of the devices having:
    a substrate of a first dopant type;
    a first doped region residing within the substrate, the doped region being of a second dopant type;
    a second dopant region residing above the first doped region;
    a third doped region residing above the second doped region;

an edge structure defining the edges of the third doped region; and a fourth structure separating the second doped region from the substrate.

5. The semiconductor of claim 4 wherein the edge structure of the second one of the plurality of devices is coupled to a reference control network.

6. The semiconductor of claim 5 wherein the reference control network controls the biasing of the edge structure.

7. The semiconductor of claim 6 wherein the fourth structure of each one of the devices is a doped region of the second dopant type.

8. The semiconductor of claim 6 wherein the fourth structure of each one of the devices is an insulator.

9. The semiconductor of claim 8 wherein the fourth structure of each one of the devices has an insulated side wall.

10. The semiconductor of claim 6 wherein one of the edge structures of one of the devices is a polysilicon gate.

11. The semiconductor of claim 6 wherein one of the fourth structures of one of the devices is a Trench Insolation (TI).

12. The semiconductor of claim 5 wherein the first doped region is connected to a reference control network for controlling the biasing of the first doped region.

* * * * *